Figure 1:
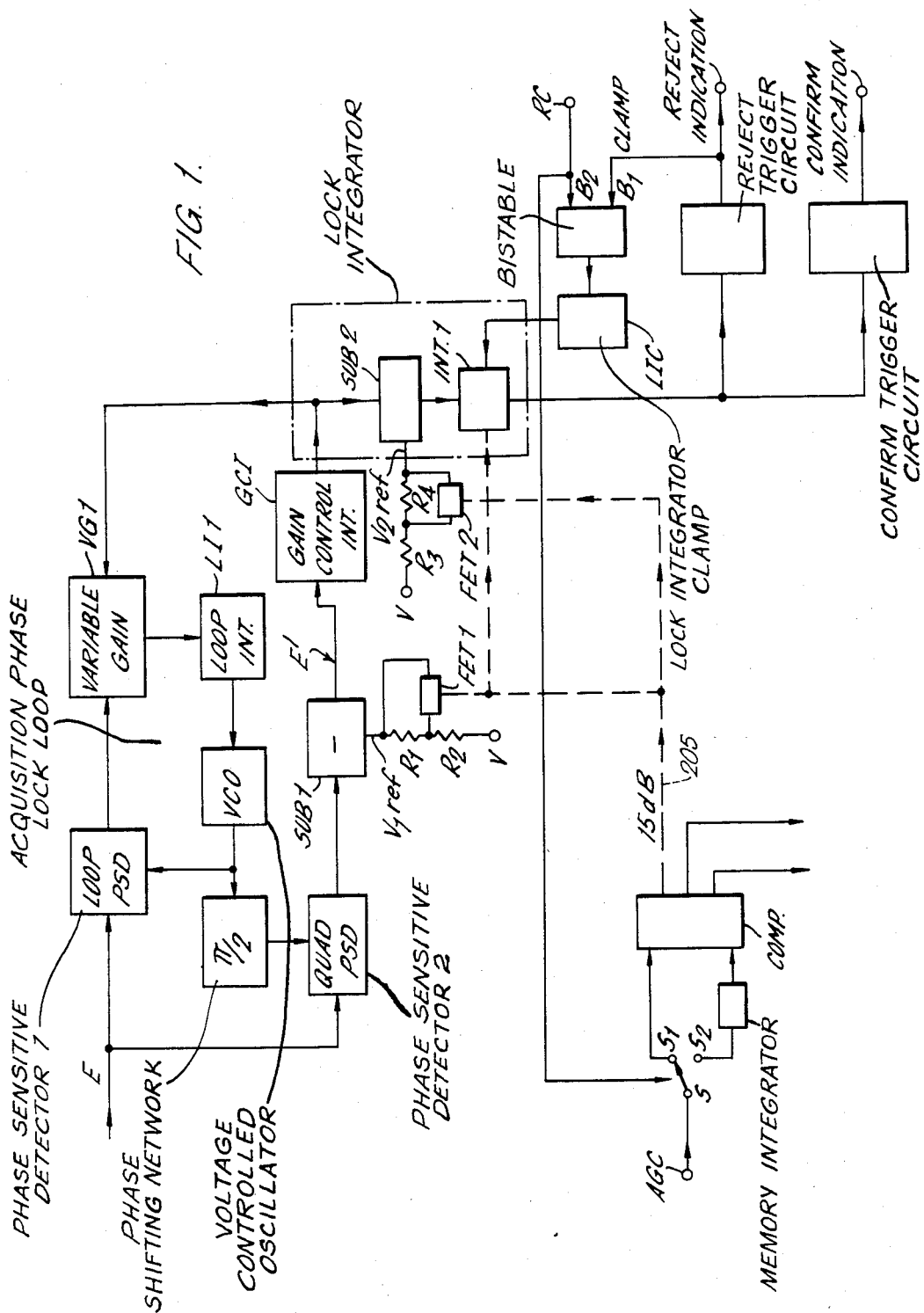

United States Patent [19]

Jones et al.

[11] Patent Number: 4,724,437

[45] Date of Patent: Feb. 9, 1988

[54] SIGNAL ACQUISITION CIRCUIT WITH VARIABLE BANDWIDTH PHASE LOCKED LOOP

[75] Inventors: Michael A. Jones, Edgware; John W. Attwood, Watford; Peter Szyszko, London; John T. Floyd, Hemel Hempstead, all of England

[73] Assignee: The Marconi Company Limited, England

[21] Appl. No.: 894,142

[22] Filed: Apr. 5, 1978

Related U.S. Application Data

[63] Continuation-in-part of Ser. No. 673,297, Apr. 2, 1976, abandoned.

[51] Int. Cl.$^4$ ............................................. G01S 13/66
[52] U.S. Cl. .................................... 342/101; 342/103; 342/62
[58] Field of Search ............... 343/7 A, 7 AG, 5 AF, 343/16 M, 8, 7 PL; 342/62, 98–103, 159, 199

[56] References Cited

U.S. PATENT DOCUMENTS

| | | | |
|---|---|---|---|
| 3,242,487 | 3/1966 | Hammack | 343/7 A |
| 3,721,977 | 3/1973 | Darboven | 343/7 A |
| 3,885,238 | 5/1975 | Klein et al. | 343/7 A |
| 3,893,113 | 7/1975 | Iten et al. | 343/7 A |
| 3,938,148 | 2/1976 | Hobson | 343/7 A |
| 3,949,955 | 4/1976 | Sykes et al. | 244/3.19 |
| 3,953,849 | 4/1976 | Couvillon | 343/7 A |
| 4,052,722 | 10/1977 | Millard | 343/5 AF |

OTHER PUBLICATIONS

RCA COS/MOS Integrated Circuits, Spec. Sheet for CD4046 Phase-Locked Loop, pp. 150–153, 1977.

Primary Examiner—T. H. Tubbesing
Assistant Examiner—Gilberto Barrón Jr.
Attorney, Agent, or Firm—Kirschstein, Kirschstein, Ottinger & Israel

[57] ABSTRACT

A signal acquisition circuit for a missile guidance system has a phase lock loop which is responsive to incoming signals received from a target and will lock on to the frequency of the received signal. The bandwidth of the phase lock loop is altered in dependence on the signal being received in order to distinguish between a valid target and noise.

7 Claims, 2 Drawing Figures

SIGNAL ACQUISITION CIRCUIT WITH VARIABLE BANDWIDTH PHASE LOCKED LOOP

This application is a continuation-in-part of earlier filed co-pending application Ser. No. 673,297 filed Apr. 2, 1976 for RADAR SYSTEMS, now abandoned.

This invention relates to radar systems and has an important application to such systems for use in missile guidance systems and adapted to confirm the acquisition of a valid target.

A difficulty encountered with radar systems for use in missile guidance systems is to distinguish between a valid target signal and a noise signal and it is an object of this invention to provide a signal acquisition circuit which alleviates this difficulty.

According to the present invention a signal acquisition circuit for a radar system comprises a phase lock loop to which an input signal is applied, a variable frequency oscillator in the phase lock loop, said oscillator having a signal output, means for locking the frequency of the variable frequency oscillator, comparison means arranged to determine the magnitude of a part of the input signal within the bandwidth of the phase lock loop and in phase coherence with the variable frequency oscillator, and to provide an output signal indicative of said magnitude, and means for varying the bandwidth of the phase lock loop in accordance with the output signal from the comparison means until the bandwidth stabilizes and the output signal of the comparison means is brought to a first predetermined value.

The signal acquisition circuit may include first detection means arranged to produce an output signal dependent on whether the output signal from the comparison means is above or below a second predetermined value when said bandwidth stabilizes.

The signal acquisition circuit may also include a confirm trigger circuit and a reject trigger circuit connected to receive the output signal from the first detection means, the confirm trigger circuit being arranged to produce a confirm target signal if the phase lock loop stabilizes at a relatively narrow bandwidth, and the reject trigger circuit being arranged to produce a reject signal if the phase lock loop stabilizes at a relatively broad bandwidth.

The comparison means may comprise a quadrature phase sensitive detector to which said input signal and said signal output from the variable frequency oscillator are applied, the output of the quadrature phase sensitive detector providing the output signal indicative of said magnitude.

The means for varying the bandwidth of the phase lock loop may comprise a first subtraction circuit arranged to subtract the output signal of the comparison means from a first d.c. reference signal and provide an output signal, and a first integrator connected to receive the output signal from the first subtraction circuit and to control a variable gain circuit in the phase lock loop whereby to vary the bandwidth of the phase lock loop.

The first detection means may include a second subtraction circuit arranged to subtract an output signal of the first integrator from a second d.c. reference signal and provide an output signal, and a second integrator connected to receive the output signal of the second subtraction circuit, the output of the second integrator being the output signal of the first detection means.

In a further preferred form the signal acquisition circuit includes means for monitoring and storing a quantity representative of the average level of the input signal, second detection means arranged to produce an output signal when the instantaneous level of the input signal exceeds a first predetermined monitored average level, and means responsive to an output signal from said second detection means to alter the first predetermined value of the output signal of the comparison means at which the bandwidth of the phase lock loop stabilizes.

The second detection means may be arranged to produce an output signal when the instantaneous level of the input signal is within a range 6 dB to 17 dB above the predetermined average level.

The signal acquisition circuit may further include means for adjusting the values of the first and second d.c. reference signals, and means for adjusting a time constant of the second integrator when an instantaneous level of the input signal exceeds a stored average level of the input signal.

The invention will now be described, by way of example, with reference to the accompanying drawings.

Figure 2:
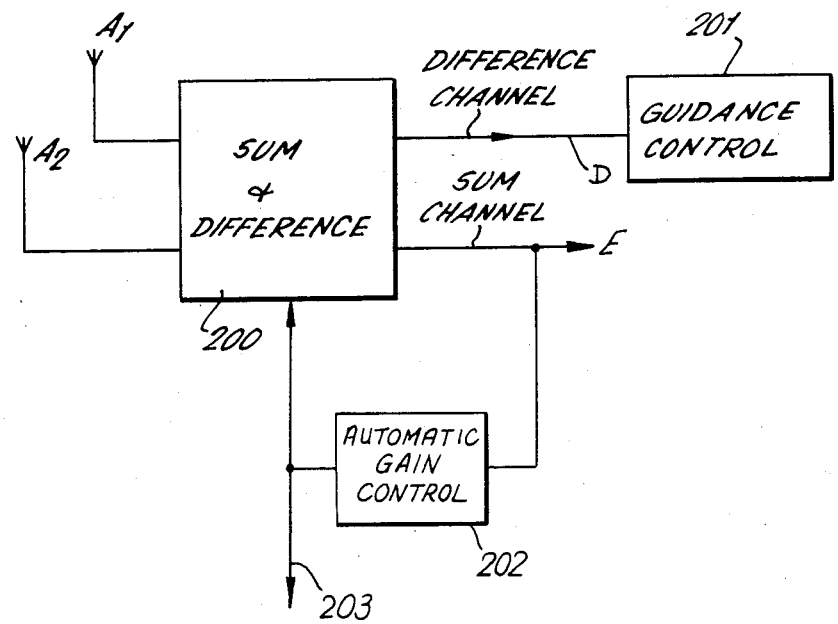

FIG. 1 shows a target acquisition circuit according to the present invention; and FIG. 2 shows a missile guidance system according to the present invention which provides the input signal for the circuit of FIG. 1.

Referring in the first instance to FIG. 2, input signals from a target are received at aerials $A_1$, $A_2$ and processed in a sum and difference circuit 200 to produce a sum signal E and a difference signal D. The sum signal E is fed to an automatic gain control circuit 202 which provides an automatic gain control signal on an output lead 203 and also controls amplifiers (not shown) in the signal paths to maintain the amplitude of the sum signal E substantially constant. The difference signal D is used in known manner as an input signal for a guidance control system 201.

Referring now to FIG. 1, there is shown a single sum channel of a split channel receiver for a missile guidance system. The sum signal E from the sum and difference circuit 200 is fed to one input of a loop phase sensitive detector PSD1 and to a quadrature phase sensitive detector PSD2. A first loop termed hereinafter the acquisition phase lock loop APLL consists of the series connection of the phase sensitive detector PSD1 with a variable gain circuit VG1, a loop integrator LI1, and a voltage controlled variable frequency oscillator VCO.

The output of the voltage controlled oscillator VCO is fed to another input of the quadrature phase sensitive detector PSD2 via a 90° phase shifting network PS, the output of the quadrature phase sensitive detector PSD2 being fed via a subtraction network SUB1 to a gain control integrating circuit GCI. The output of the gain control integrating circuit GCI is fed to a second input of the variable gain circuit VG1 and to the single input of a lock integrator circuit LI. The gain of the variable gain circuit VG1 between the input from the phase sensitive detector PSD1, and the output to the loop integrator LI1 is controlled by the input from the gain control integrator GC1. The natural frequency and bandwidth of the acquisition phase lock loop APLL are defined by the combined sensitivities of the phase sensitive detector PSD1, the loop integrator LI1 and the variable frequency oscillator VCO in a manner well known in the art. The variable gain circuit VG1, which is in series with the output of the phase sensitive detector PSD1, causes the natural frequency and bandwidth of the phase lock loop APLL to be varied in a well known manner so that when the gain of the variable gain circuit VG1 is minimum the bandwidth is relatively narrow and when the gain of the variable gain circuit is maximum the bandwidth is relatively broad.

The output of the lock integrator circuit LI is connected to the respective inputs of a reject trigger circuit RTC and a confirm trigger circuit CTC. The output of the confirm trigger circuit CTC is fed to the guidance circuitry of the missile (not shown) to indicate that a target signal is confirmed. The output of the reject trigger circuit RTC is fed to the guidance circuitry of the missile to indicate that a target signal is not present and to one input $B_1$ of a bistable circuit B. The output of the bistable circuit B is fed to a lock integrator clamp circuit LIC which when toggled by the reject trigger circuit RTC gives an output to reset the lock integrator circuit LI.

A second input $B_2$ to the bistable circuit B is applied to an input terminal RC and is obtained from a receiver as will be explained hereinafter. This second input is connected also to a control for a switch S which though shown in mechanical form will normally be an electronic changeover switch. The wiper of the switch S is connected to an input terminal AGC to which is applied an automatic gain control signal from output lead 203 in FIG. 2. The automatic gain control signal from the automatic gain control circuit 202, which has a logarithmic characteristic, is a measure in a logarithmic form of the strength of the input signal to the receiver. In the switch position $S_1$ shown the automatic gain control signal from output lead 203 is connected to one input of a comparator COMP. In the second switch position $S_2$ the automatic gain control signal from output lead 203 is connected via a memory-integrator MI to a second input of the comparator COMP. The memory-integrator MI stores the average level of input from the output lead 203 which represents in a logarithmic manner the average noise input level and presents this to the comparator COMP at all times. When the switch S is in the position $S_1$ this average value is compared with the instantaneous value in the comparator COMP.

A number of outputs may be obtained from the comparator COMP for example indicating on respective outputs when the instantaneous value is greater than 6dB, 15dB and 17dB with respect to the averaged a.g.c. level. If the instantaneous value is greater than 15dB with respect to the average stored value then an output is given which causes the field effect transistor switch FET1 to open and alter the reference voltage of the subtraction circuit SUB1 and the time constant of the integrator INT1 in the lock integrator LI, and also causes the field effect transistor FET2 to open and alter the reference voltage of the subtraction circuit SUB2. The reason for these alterations will be explained hereafter.

In order to facilitate understanding of the invention the nature of the input signal will now be considered before describing the operation of the circuit. The sum signal E is at a frequency in the region of 500 KHz and if this signal represents a valid target signal its bandwidth will be in the range of 1 to 5 Hz under normal conditions. The sum signal is received in a continuous manner for the time during which the receiver locks on to that particular frequency range. The choice of the frequency range is obtained by allowing the receiver centre frequency to sweep over a range of frequencies until a signal input of for example greater than 6 dB's above the noise level is detected. The centre frequency is then kept constant for a sufficient time to allow the circuit of the present invention to assess the content of the modulated or IF signal E. The circuitry for tuning the original R.F. signal is not shown but is well known in the art.

If the sum signal E is not a valid single target signal then there are a number of possibilities. The two most likely signals are from a noise source in which case the input signal will be a band of noise which will normally have a bandwidth greater than 50 Hz; or a multiple target signal. There are two distinct types of multiple target signal. The first type of multiple target signal is obtained from a small number, for example two or three targets flying in close formation and the sum signal E will then have two or three distinctly identifiable input signal peaks within a limited bandwidth. The second type of multiple target signal is obtained from a large number, for example ten or more targets flying in close formation. The sum signal E will then look very much like a noise signal but the level of signal will be greater than the average noise signal and the switch S, and comparator COMP will process such a signal as will be explained hereinafter.

Referring now to FIG. 1, it is firstly assumed that the receiver after a certain amount of frequency sweeping locks on to a valid target signal so that the sum signal E will have a bandwidth of say 1 Hz. Initially the output of the gain control integrator GCI is assumed to be such as to cause the variable gain circuit VG1 to provide maximum gain so that initially the bandwidth of the adaptive phase lock loop APLL is relatively broad, for example 1 KHz. The frequency of the variable frequency oscillator VCO of the adaptive phase lock loop APLL will then rapidly pull towards and lock to the sum signal E in a manner well known in the art. The output of the loop phase sensitive detector PSD1 will then be zero volts and the output of the variable frequency oscillator VCO will be in phase and have the same frequency as the sum signal E. The 90° phase shifting circuit PS will cause the output of the quadrature phase detector PSD2 to be proportional to E volts. This output is subtracted from the reference voltage $V_1$ ref. in the subtraction circuit SUB1 and the resultant output is integrated by the gain control integrator GCI to produce an output which is fed to the variable gain circuit VG1 and to the lock integrator LI which consists of a subtraction circuit SUB2 and an integrating circuit INT1.

If the output of the quadrature phase sensitive detector PSD2 exceeds the reference voltage $V_1$ ref. from which this output is subtracted in subtraction circuit SUB1, then there is a positive output which is integrated by the gain control integrator GCI, the output of which will cause the gain of the variable gain circuit VG1 to be reduced. Provided that the output of the quadrature phase sensitive detector PSD2 continues to exceed the reference voltage $V_1$ ref. the output of the gain control integrator GCI will continue to change until it reaches the limit of its operating range when the gain of the variable gain circuit VG1 will be a minimum. The bandwidth of the adaptive phase lock loop APLL will then be at a minimum value, but provided that the bandwidth of the sum signal E due to the target is less than this minimum value the adaptive phase lock loop APLL will remain in phase lock and the output of the quadrature phase sensitive detector PSD2 will remain proportional to E volts.

The output of the gain control integrator GC1 is subtracted from the reference voltage $V_2$ ref in the subtraction circuit SUB2, the output of which is integrated by the integrator INT1. The circuit tolerances are designed so that there is a positive output from the subtraction circuit SUB2 when the sum signal E represents a valid target signal, the output of the gain control integrator GCI being such as to produce a low gain from the variable gain circuit VG1. The output of the integrator INT1 builds up and at a predetermined level it is arranged to trigger the confirm trigger circuit CTC which locks the modulating frequency such that the missile guidance system continues to track the object from which the sum signal E is being derived.

Assume now that the sum signal E is derived from a band of noise of for example 600 Hz bandwidth and assume that the output of the gain control integrator GCI is such as to cause the variable gain circuit VG1 to provide maximum gain. The bandwidth of the adaptive phase lock loop APLL and therefore the output signal from the variable frequency oscillator VCO will initially be relatively broad, for example 1 KHz. Since the bandwidth of the adaptive phase lock loop APLL is broader than the bandwidth of the sum signal E, the adaptive phase lock loop APLL will pull in and lock to the sum signal E. The output of the quadrature phase sensitive detector PSD2 will again be a d.c. voltage proportional to the sum voltage E and will be greater than $V_1$ ref. Hence the resultant output of the subtraction circuit SUB1 will be integrated by the gain control integrator GCI and will produce a positive input at the variable gain circuit VG1 to reduce the gain of the variable gain circuit VG1. Consequently the bandwidth of the adaptive phase lock loop APLL and hence of the output of the variable frequency oscillator VCO will be caused to narrow.

As the bandwidth of the adaptive phase lock loop APLL narrows so the voltage of the quadrature phase sensitive detector PSD2 will fall in proportion to the ratio of the bandwidth of the adaptive phase lock loop APLL to the bandwidth of the sum signal E, since the reduced bandwidth loop APLL is unable to follow and remain in phase lock with the higher frequency variations of the sum signal E. This fall in voltage will continue very rapidly, due to the feedback, by way of the gain control integrator GCI until the output of the quadrature phase sensitive detector PSD2 equals the reference voltage $V_1$ ref. at which time the adaptive phase lock loop APLL will stabilize. The output of the gain control integrator GCI will then be at a steady level and the level will be that of the input to the subtraction circuit SUB2 in the locking integrator LI. By suitable choice of the reference voltages $V_1$ ref. and $V_2$ ref. it can be arranged that the level of the output signal from the gain control integrator GCI necessary to reduce the bandwidth of the adaptive phase lock loop APLL to for example 30 Hz is not sufficient to overcome the reference voltage $V_2$ ref. of the subtraction circuit SUB2 and therefore not sufficient to trigger the confirm trigger circuit CTC.

The subtraction circuit SUB2 of the locking integrator LI will therefore give a negative output and this output is integrated in the integrator INT1 and the resultant integrated output is used to trigger the reject trigger circuit RTC. The resultant output from the reject trigger circuit RTC is used to change over the condition of the bistable circuit B which actuates the lock integrator clamp LIC and resets the locking integrator circuit LI to an initial condition.

The output from the reject trigger circuit RTC is also used to provide a signal in the receiver to force the receiver to recommence sweeping of its modulation frequency so as to search for an alternative target. If the sum signal E is derived from a plurality of targets, for example ten or more, then a new procedure is required. This is because the sum signal E will look like a noise signal of narrower bandwidth than that of thermal noise and rejection of this input signal by the reject trigger circuit RTC would result in the missile missing all the targets.

Each time that sum signal E above the noise level is received a release clamp signal is received at an input terminal RC. This release clamp signal sets the bistable B and this releases the lock integrator clamp circuit LIC which previously was resetting the lock integrator LI to an initial value. The release clamp signal received at input terminal RC also changes over the switch S (by means for example of an FET switch as previously described). The memory integrator MI then retains a signal representative in a logarithmic form of the average level of the input signals received at aerials $A_1$, $A_2$ during the previous sweep of the modulating frequency, obtained by monitoring the level of the automatic gain control signal receiver. Since the signal normally received at aerials $A_1$, $A_2$ is a noise signal the output of the memory integrator MI is representative of the average input noise level.

With the switch S now in the position S1 the comparator COMP compares the instantaneous signal input in logarithmic form of the receiver with the average noise input. If the instantaneous signal is for example 15 dB greater than the average noise signal input then it is assumed that the receiver is receiving signals of great strength indicating a plurality of targets. When such a signal input of 15 dB greater than the average is received a signal is given by the comparator COMP on the dotted line output 205. This signal operates the FET switches FET1 and FET2 so reducing the reference voltage $V_1$ ref. into the subtraction circuit SUB1 also reducing the reference voltage $V_2$ ref applied to the subtraction circuit SUB2 by open circuiting field effect transistor FET2 which is in parallel with resistor R4 and also increasing the time constant of the integrator INT1 of the lock integrator LI by introducing in a similar manner further resistance or capacitance using a similar field effect transistor switching arrangement (not shown).

The above three alterations in circuit parameters have the effect of increasing the difference in the acquisition phase lock loop bandwidth, as indicated by the output of the gain control integrator GCI, between when the loop is tracking a plurality of targets and when it is tracking noise. The lock integrator LI time constant is also made longer thus allowing more time for a decision to be made.

We claim:

1. A signal acquisition circuit for a radar system, comprising:
   (a) a phase lock loop to which an input signal is applied;
   (b) a variable frequency oscillator in the phase lock loop, said oscillator having a signal output;
   (c) means for locking the frequency of said variable frequency oscillator;

(d) comparison means arranged to determine the magnitude of a part of the input signal within the bandwidth of the phase lock loop and in phase coherence with the variable frequency oscillator, and to provide an output signal indicative of said magnitude;

(e) means for varying the bandwidth of the phase lock loop in accordance with the output signal from the comparison means until the bandwidth stabilizes and the output signal of the comparison means is brought to a first predetermined value;

(f) first detection means arranged to produce an output signal dependent on whether the output signal from the comparison means is above or below a second predetermined value when said bandwidth stabilizes; and (g) a confirm trigger circuit and a reject trigger circuit connected to receive the output signal from the first detection means, the confirm trigger circuit being arranged to produce a confirm target signal if the phase lock loop stabilizes at a relatively narrow bandwidth, and the reject trigger circuit being arranged to produce a reject signal if the phase lock loop stabilizes at a relatively broad bandwidth.

2. A signal acquisition circuit as claimed in claim 1, wherein the comparison means comprises a quadrature phase sensitive detector to which said input signal and said signal output from the variable frequency oscillator are applied, the output of the quadrature phase sensitive detector providing the output signal indicative of said magnitude.

3. A signal acquisition circuit as claimed in claim 1, wherein the means for varying the bandwidth of the phase lock loop comprises a first subtraction circuit arranged to subtract the output signal of the comparison means from a first d.c. reference signal and provide an output signal, and a first integrator connected to receive the output signal from the first subtraction circuit, and to control a variable gain circuit in the phase lock loop whereby to vary the bandwidth of the phase lock loop.

4. A signal acquisition circuit as claimed in claim 3, wherein said first detection means comprises a second subtraction circuit arranged to subtract an output signal of said first integrator from a second d.c. reference signal and provide an output signal, and a second integrator connected to receive the output signal of the second subtraction circuit and provide the output signal of said first detection means.

5. A signal acquisition circuit as claimed in claim 3, including means for monitoring and storing a quantity representative of the average level of the input signal, second detection means arranged to produce an output signal when the instantaneous level of the input signal exceeds a first predetermined monitored average level, and means responsive to an output signal from said second detection means to alter the first predetermined value of the output signal of the comparison means at which the bandwidth of the phase lock loop stabilizes.

6. A signal acquisition circuit as claimed in claim 5, wherein the second detection means is arranged to produce an output signal when the instantaneous level of the input signal is within a range 6 dB to 17 dB above the predetermined average level.

7. A signal acquisition circuit as claimed in claim 6, including means for adjusting the values of the first and second d.c. reference signals, and means for adjusting a time constant of the second integrator when an instantaneous level of the input signal exceeds a stored average level of the input signal.

* * * * *